(12) United States Patent
Resch

(10) Patent No.: US 10,387,248 B2
(45) Date of Patent: Aug. 20, 2019

(54) ALLOCATING DATA FOR STORAGE BY UTILIZING A LOCATION-BASED HIERARCHY IN A DISPERSED STORAGE NETWORK

(71) Applicant: International Business Machines Corporation, Armonk, NY (US)

(72) Inventor: Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/232,147

(22) Filed: Aug. 9, 2016

(65) Prior Publication Data

US 2017/0286222 A1    Oct. 5, 2017

Related U.S. Application Data

(60) Provisional application No. 62/314,839, filed on Mar. 29, 2016.

(51) Int. Cl.
*G06F 11/10*     (2006.01)
*G06F 3/06*      (2006.01)
(Continued)

(52) U.S. Cl.
CPC .......... *G06F 11/1076* (2013.01); *G06F 3/061* (2013.01); *G06F 3/064* (2013.01); *G06F 3/0604* (2013.01); *G06F 3/067* (2013.01); *G06F 3/0619* (2013.01); *G06F 3/0631* (2013.01); *G06F 3/0635* (2013.01); *G06F 3/0644* (2013.01); *G06F 3/0647* (2013.01); *G06F 3/0653* (2013.01); *G06F 3/0659* (2013.01); *G06F 11/1092* (2013.01); *G06F 11/1662* (2013.01); *G06F 11/3684* (2013.01); *G06F 11/3688* (2013.01); *G06F 11/3692* (2013.01); *H03M 13/1515* (2013.01); *H03M 13/616* (2013.01);
(Continued)

(58) Field of Classification Search
CPC .... G06F 11/1076; G06F 3/0619; G06F 3/064; G06F 3/067
See application file for complete search history.

(56) References Cited

U.S. PATENT DOCUMENTS 4,092,732 A    5/1978    Ouchi
5,454,101 A    9/1995    Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Kyle Vallecillo
(74) *Attorney, Agent, or Firm* — Garlick & Markison; Timothy W. Markison; Patricia A. Markison

(57) ABSTRACT

A method for execution by a dispersed storage and task (DST) processing unit includes generating storage allocation data indicating a subset of a plurality of storage units based on storage location hierarchy data and an information dispersal algorithm (IDA) width. A plurality of write requests corresponding to each storage unit in the first subset are generated for transmission via a network, where each of the plurality of write requests includes one of a plurality of encoded slices of a data object.

18 Claims, 7 Drawing Sheets

(51) Int. Cl.
*H04L 29/08* (2006.01)
*G06F 11/36* (2006.01)
*G06F 11/16* (2006.01)
*H03M 13/15* (2006.01)
*H03M 13/00* (2006.01)
*H03M 13/37* (2006.01)

(52) U.S. Cl.
CPC .... *H04L 67/1097* (2013.01); *G06F 2201/805* (2013.01); *G06F 2201/82* (2013.01); *H03M 13/373* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2011/0055661 | A1* | 3/2011 | Grube ................ G06F 11/1092 714/763 |
| 2013/0232503 | A1* | 9/2013 | Volvovski ........... G06F 11/1044 718/104 |
| 2013/0238900 | A1* | 9/2013 | Leggette ............. H04L 63/0428 713/165 |
| 2013/0346795 | A1* | 12/2013 | Gladwin ............. G06F 12/1458 714/6.22 |
| 2014/0068259 | A1* | 3/2014 | Resch ................ G06F 21/6272 713/167 |
| 2014/0223095 | A1* | 8/2014 | Storm .................... G06F 3/067 711/114 |
| 2014/0245063 | A1* | 8/2014 | Baptist ............... G06F 11/2094 714/6.22 |
| 2014/0330921 | A1* | 11/2014 | Storm ................. H04L 67/1097 709/213 |
| 2014/0359276 | A1* | 12/2014 | Resch ................ H04L 63/0457 713/153 |
| 2014/0359348 | A1* | 12/2014 | Volvovski ........... G06F 11/1092 714/6.22 |
| 2015/0006594 | A1* | 1/2015 | Volvovski ......... G06F 17/30194 707/827 |
| 2015/0040134 | A1* | 2/2015 | Leggette ............. H04L 67/1097 718/103 |
| 2015/0268692 | A1* | 9/2015 | Viallet .................... G01L 1/146 345/174 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Hung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

(56) References Cited

OTHER PUBLICATIONS

Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner distributed, or dispersed, storage network (DSN) 10

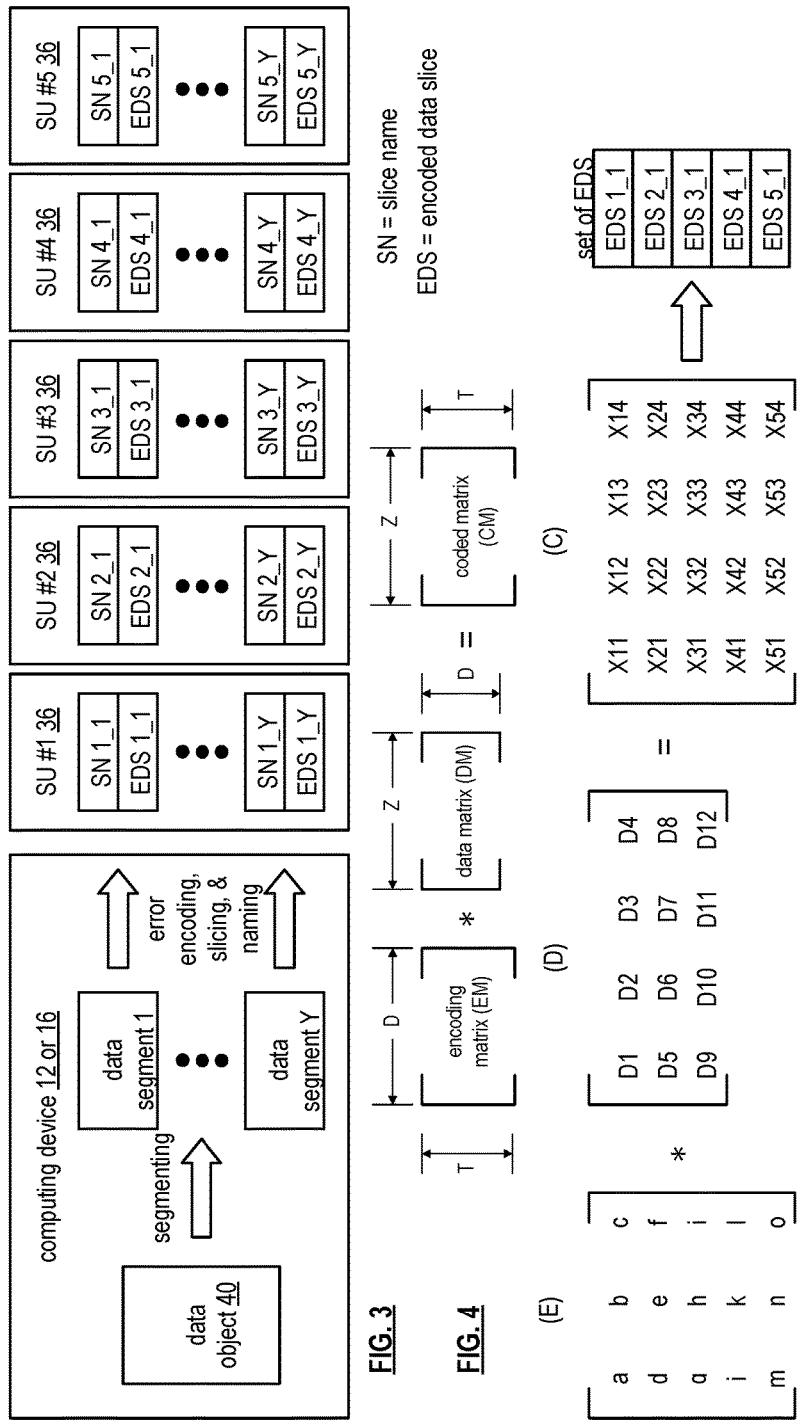

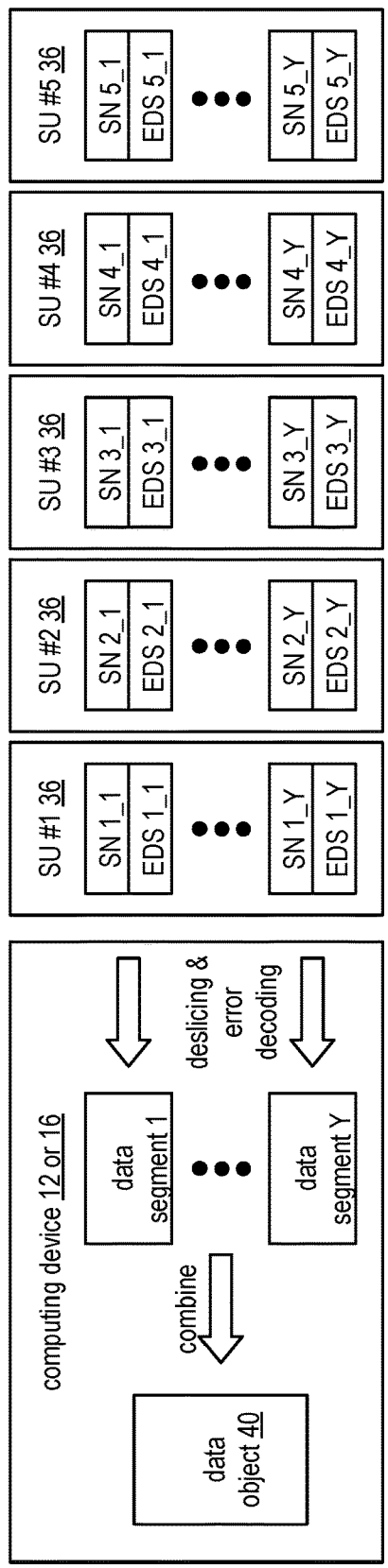

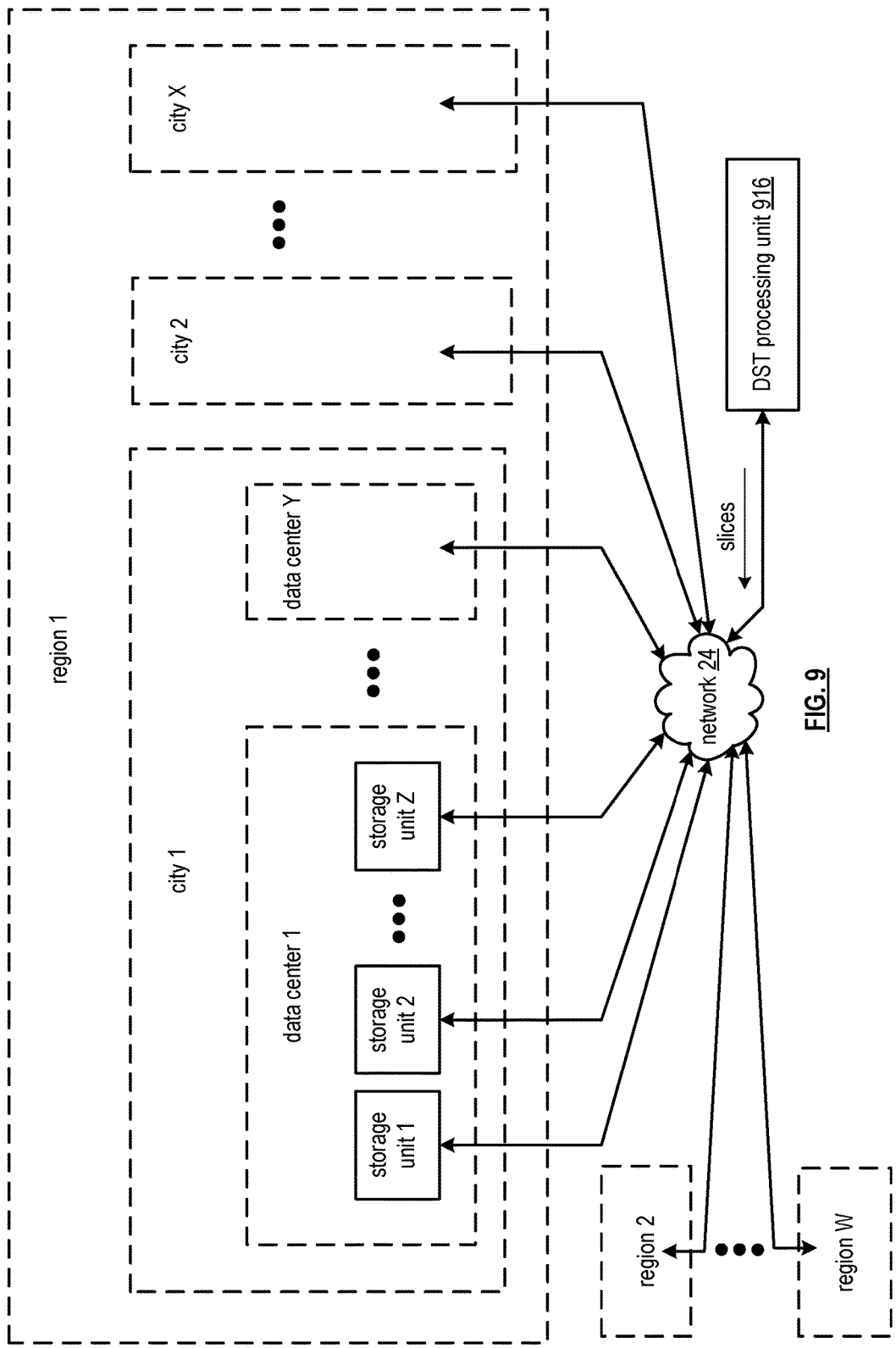

ALLOCATING DATA FOR STORAGE BY UTILIZING A LOCATION-BASED HIERARCHY IN A DISPERSED STORAGE NETWORK

CROSS-REFERENCE TO RELATED APPLICATIONS

The present U.S. Utility Patent Applications claims priority pursuant to 35 U.S.C. § 119(e) to U.S. Provisional Application No. 62/314,839, entitled "PROCESSING AN ENCODED DATA SLICE IN A DISPERSED STORAGE NETWORK", filed Mar. 29, 2016, which is hereby incorporated herein by reference in its entirety and made part of the present U.S. Utility Patent Applications for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 7 is a schematic block diagram of an example of dispersed storage error decoding of data in accordance with the present invention;

FIG. 8 is a schematic block diagram of a generic example of an error decoding function in accordance with the present invention;

FIG. 9 is a schematic block diagram of an embodiment of a dispersed or distributed storage network (DSN) in accordance with the present invention;

DETAILED DESCRIPTION OF THE INVENTION

Figure 1:
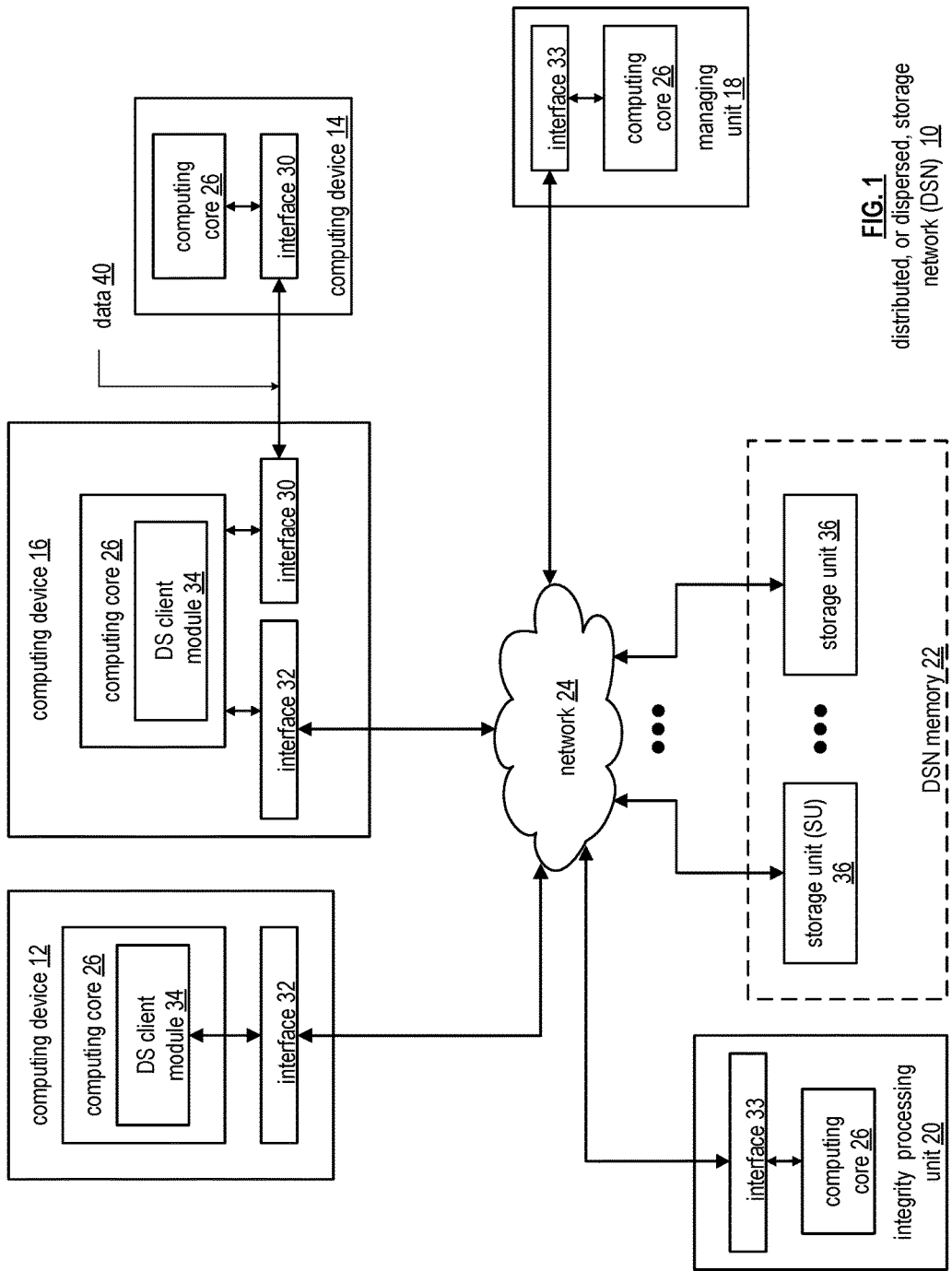
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
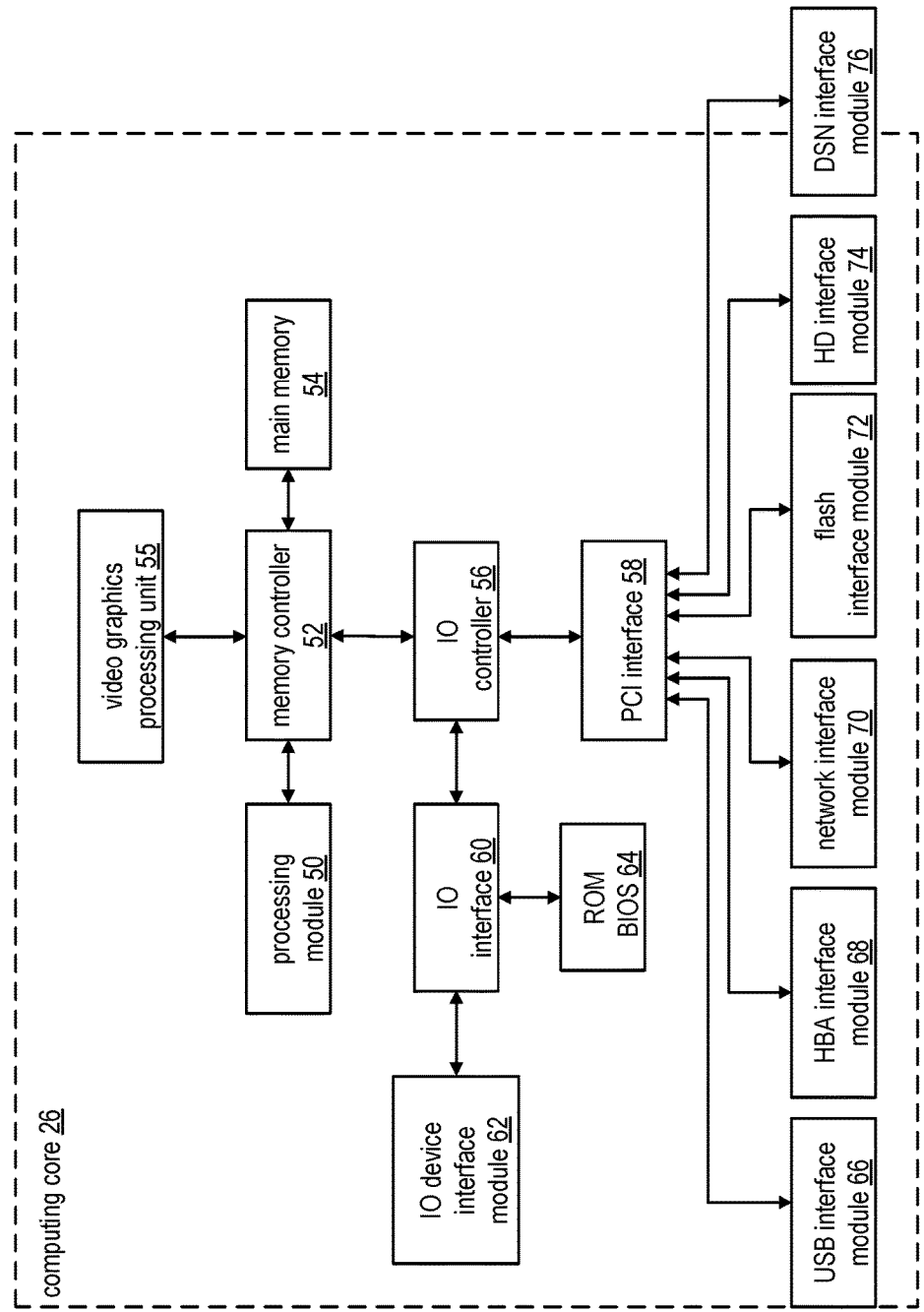
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

In various embodiments, each of the storage units operates as a distributed storage and task (DST) execution unit, and is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. Hereafter, a storage unit may be interchangeably referred to as a dispersed storage and task (DST) execution unit and a set of storage units may be interchangeably referred to as a set of DST execution units.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each managing unit 18 and the integrity processing unit 20 may be separate computing devices, may be a common computing device, and/or may be integrated into one or more of the computing devices 12-16 and/or into one or more of the storage units 36. In various embodiments, computing devices 12-16 can include user devices and/or can be utilized by a requesting entity generating access requests, which can include requests to read or write data to storage units in the DSN.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an 10 interface module 60, at least one 10 device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. Here, the computing device stores data object 40, which can include a file (e.g., text, video, audio, etc.), or other data arrangement. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides data object 40 into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

FIG. 9 is a schematic block diagram of another embodiment of a dispersed storage network (DSN) that includes a DST processing unit 916, the network 24 of FIG. 1, and a plurality of regions 1-W. Each region can include a plurality of cities 1-X, where the number of cities can be the same or different for each region. Each city can include a plurality of data centers 1-Y, where the number of data centers can be the same or different for each city. Each data center can include a plurality of storage units 1-Z, each connected to network 24, where the number of storage units can be the same or different for each data center. The DST processing unit 916 can include the interface 32 of FIG. 1, the computing core 26 of FIG. 1, and the DS client module 34 of FIG. 1. The DST processing unit 916 can be implemented utilizing a computing device 16 of FIG. 1 functioning as a dispersed storage processing agent for computing device 14 as described previously. Each storage unit may be implemented utilizing the storage unit 36 of FIG. 1. The DSN functions to allocate data for storage by utilizing a location-based hierarchy.

A DSN memory can utilize a hierarchical organization of locations for storing slices as an alternative to a fully logically organized namespace. This requires that the product of the number of locations selected for each level at least equals an Information Dispersal Algorithm (IDA) width, which can include the pillar width discussed previously. For example, consider a DSN memory organized utilizing a location-based hierarchy where, at the top-most level of the hierarchy, are 3 regions, from which at least 2 must be selected: a "Region Width" of 2. Within each of the 3 regions, are 3 to 5 cities, from which at least 3 must be selected: a "City Width" of 3 Within each of the city are 2 data centers, from which at least 2 must be selected: a "Data Center Width" of 2. Within each data center are at least 4 storage units, with the number selected determined by IDA width: a "storage unit Width" of 4. In various embodiments, the hierarchy can have any number of location-based levels. In various embodiments the widths at each level can be received as parameter data and/or can be calculated based on a deterministic function.

Multiplying each of the widths in this example, the Region Width of 2, the City Width of 3, the Data Center Width of 2, and the ds unit Width of 4 yields 2*3*2*4=48. Thus, for any possible selection of regions, cities, or data centers, there is a maximum possible selection of 48 ds units, and IDA width is limited to be less than 48. Note, however, that other IDA widths are possible, resulting in different numbers of ds units being selected from each data center. In this example, an IDA width of 24 would result in 2 storage units (out of the 4) selected from each data center. Selection of the Width number of locations at each level of the hierarchy may be based on a deterministic function, such as a Decentralized Agreement Protocol (DAP). Selection can begin at the top most level of the hierarchy, with each selection further constraining and limiting the selection paths for the lower levels. For example, selecting an "East Coast" region might then limited city selection from among cities that exist on the east coast. Such constraints can be received as parameter data received by the DST processing unit via the network, and can include explicit locations to be included, or weight data indicating different weights corresponding to the different locations, where the storage units are further selected based on the weight data. Once the bottom-most level of the hierarchy is selected, based on the total number of locations selected, and the IDA width, the storage units can be selected, where number of storage units chosen is calculated by dividing the IDA Width by the total number of bottom-level locations selected. For the example above, if 12 data centers are selected, and the IDA width is 36, then the number of storage units selected=36/12=3. In various embodiments, the bottom-level of the hierarchy can depend on the IDA width. For example, the bottom-level of the hierarchy can end with the cities if the IDA width is small. For example, if the IDA width is 6, after selecting 2 regions and 3 cities from each region, one storage unit will be selected from each region, regardless of data center location, because the IDA width of 6 has already been achieved. The selection can use a DAP or be logically spread out as far as possible over a logical namespace within that bottom-most level. When changes to the hierarchy occur, such as adding a new city to a region, slices can be remapped within that region according to the deterministic functions applied at the level of cities within that region. This can also change the "weight" of that region with the DAP at the region level, and result in some cross-region movement of slices.

In various embodiments, a processing system of a dispersed storage and task (DST) processing unit includes at least one processor and a memory that stores operational instructions, that when executed by the at least one processor cause the processing system to generate storage allocation data indicating a first subset of a plurality of storage units based on storage location hierarchy data and an information dispersal algorithm (IDA) width. A first plurality of write requests corresponding to each storage unit in the first subset are generated for transmission via a network, where each of the first plurality of write requests includes one of a plurality of encoded slices of a data object.

In various embodiments, the storage location hierarchy data is generated based on a decentralized agreement protocol (DAP). In various embodiments, generating the storage allocation data is further based on a desired number of data locations and a location-based width, wherein the first subset of the plurality of storage units includes a plurality of location-based subsets based on the desired number of data locations, each corresponding to a distinct one of a plurality of data locations, wherein the size of each of the plurality of location-based subsets is based on the location-based width, and wherein each of the plurality of location-based subsets includes storage units located at the corresponding distinct one of the plurality of unique data locations. In various embodiments, the location-based width is calculated by dividing the IDA width by the desired number of data locations. In various embodiments, the desired number of data locations corresponds to the size of a set of desired data locations, and wherein the set of desired data locations includes the plurality of data locations. In various embodiments, the set of desired data locations includes a plurality of data centers.

In various embodiments, the set of desired data locations is selected based on location parameter data received via the network. In various embodiments, the location parameter data includes location weight data indicating at least one location weight corresponding to at least one of: at least one region, at least one city, or at least one data center, wherein a distribution of the plurality of data locations in the set of desired data locations is based on the location weight data.

In various embodiments, each of the plurality of location-based subsets corresponds to a distinct one of a plurality of regions, wherein each of the plurality of location-based subsets further includes a plurality of city-based subsets, each corresponding to a distinct one of a plurality of cities located in the distinct one of the plurality of regions, wherein each of the plurality of city-based subsets includes a plurality of center-based subsets, each corresponding to a distinct one of a plurality of data centers located in the distinct one of the plurality of cities, and wherein the location-based subsets, city-based subsets, and center-based subsets are selected based on the storage location hierarchy data. In various embodiments, the number of location-based subsets is based on region-based width corresponding to a desired number of regions, wherein the number of city-based subsets in each of the plurality of location-based subsets is based on a city-based width corresponding to a desired number of cities in each region, wherein the number of center-based subsets in each of the plurality of city-based subsets each of the center-based subsets is based on a center-based width corresponding to a desired number of data centers in each city, and wherein the size of each of the plurality of center-based subsets is based on a storage-unit based width corresponding to a desired number of storage units in each data center.

In various embodiments, the desired number of regions, the desired number of cities in each region, the desired number of data centers in each city, and/or the desired number of storage units in each data center is calculated based on a decentralized agreement protocol (DAP). In various embodiments, width parameter data is received via the network that indicates the desired number of regions, the desired number of cities in each region, the desired number of data centers in each city, and/or the desired number of storage units in each data center.

In various embodiments, reassignment data is generated in response to a change in the storage location hierarchy data, wherein the reassignment data indicating a mapping of the plurality of encoded slices to a new subset of a second plurality of storage units based on the change in the storage location hierarchy data. A second plurality of write requests corresponding to each storage unit in the new subset is generated for transmission via the network, wherein each of the second plurality of write requests includes one of the plurality of encoded slices of a data object based on the reassignment data.

Figure 10:
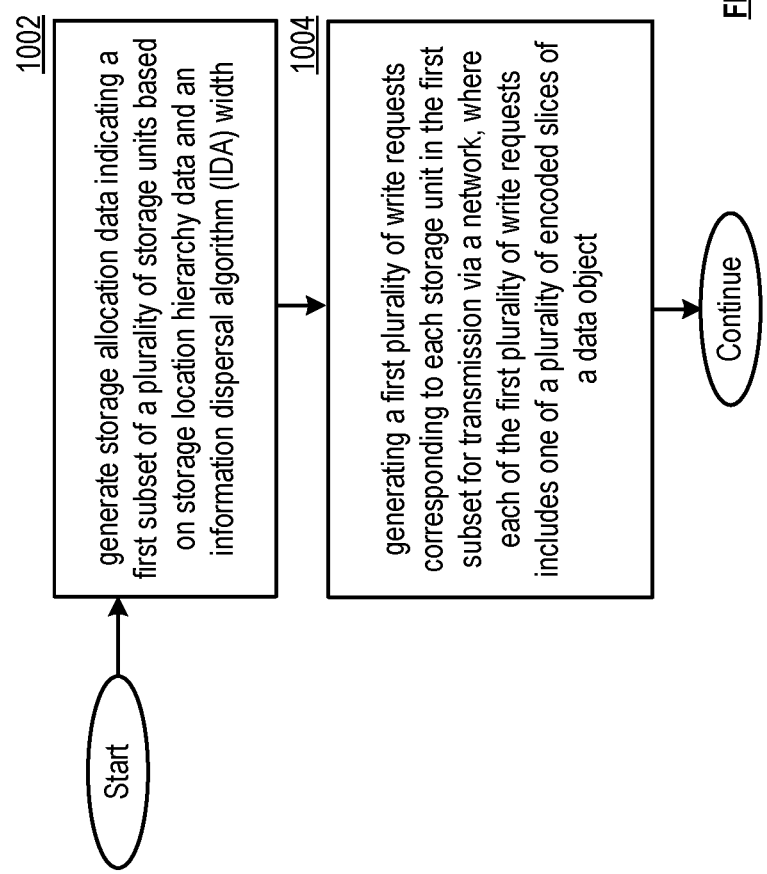
FIG. 10 is a logic diagram of an example of a method of allocating data for storage by utilizing a location-based hierarchy in accordance with the present invention.

FIG. 10 is a flowchart illustrating an example of allocating data for storage by utilizing a location-based hierarchy. In particular, a method is presented for use in association with one or more functions and features described in conjunction with FIGS. 1-9, for execution by a dispersed storage and task (DST) processing unit that includes a processor or via another processing system of a dispersed storage network that includes at least one processor and memory that stores instruction that configure the processor or processors to perform the steps described below. Step 1002 includes generating storage allocation data indicating a first subset of a plurality of storage units based on storage location hierarchy data and an information dispersal algorithm (IDA) width. Step 1004 includes generating a first plurality of write requests corresponding to each storage unit in the first subset for transmission via a network, where each of the first plurality of write requests includes one of a plurality of encoded slices of a data object.

In various embodiments, the storage location hierarchy data is generated based on a decentralized agreement protocol (DAP). In various embodiments, generating the storage allocation data is further based on a desired number of data locations and a location-based width, wherein the first subset of the plurality of storage units includes a plurality of location-based subsets based on the desired number of data locations, each corresponding to a distinct one of a plurality of data locations, wherein the size of each of the plurality of location-based subsets is based on the location-based width, and wherein each of the plurality of location-based subsets includes storage units located at the corresponding distinct one of the plurality of unique data locations. In various embodiments, the location-based width is calculated by dividing the IDA width by the desired number of data locations. In various embodiments, the desired number of data locations corresponds to the size of a set of desired data locations, and wherein the set of desired data locations includes the plurality of data locations. In various embodiments, the set of desired data locations includes a plurality of data centers.

In various embodiments, the set of desired data locations is selected based on location parameter data received via the network. In various embodiments, the location parameter data includes location weight data indicating at least one location weight corresponding to at least one of: at least one region, at least one city, or at least one data center, wherein a distribution of the plurality of data locations in the set of desired data locations is based on the location weight data.

In various embodiments, each of the plurality of location-based subsets corresponds to a distinct one of a plurality of regions, wherein each of the plurality of location-based subsets further includes a plurality of city-based subsets, each corresponding to a distinct one of a plurality of cities located in the distinct one of the plurality of regions, wherein each of the plurality of city-based subsets includes a plurality of center-based subsets, each corresponding to a distinct one of a plurality of data centers located in the distinct one of the plurality of cities, and wherein the location-based subsets, city-based subsets, and center-based subsets are selected based on the storage location hierarchy data. In various embodiments, the number of location-based subsets is based on region-based width corresponding to a desired number of regions, wherein the number of city-based subsets in each of the plurality of location-based subsets is based on a city-based width corresponding to a desired number of cities in each region, wherein the number of center-based subsets in each of the plurality of city-based subsets each of the center-based subsets is based on a center-based width corresponding to a desired number of data centers in each city, and wherein the size of each of the plurality of center-based subsets is based on a storage-unit based width corresponding to a desired number of storage units in each data center.

In various embodiments, the desired number of regions, the desired number of cities in each region, the desired number of data centers in each city, and/or the desired number of storage units in each data center is calculated based on a decentralized agreement protocol (DAP). In various embodiments, width parameter data is received via the network that indicates the desired number of regions, the desired number of cities in each region, the desired number of data centers in each city, and/or the desired number of storage units in each data center.

In various embodiments, reassignment data is generated in response to a change in the storage location hierarchy data, wherein the reassignment data indicating a mapping of the plurality of encoded slices to a new subset of a second plurality of storage units based on the change in the storage location hierarchy data. A second plurality of write requests corresponding to each storage unit in the new subset is generated for transmission via the network, wherein each of the second plurality of write requests includes one of the plurality of encoded slices of a data object based on the reassignment data.

In various embodiments, a non-transitory computer readable storage medium includes at least one memory section that stores operational instructions that, when executed by a processing system of a dispersed storage network (DSN) that includes a processor and a memory, causes the processing system to generate storage allocation data indicating a first subset of a plurality of storage units based on storage location hierarchy data and an information dispersal algorithm (IDA) width. A first plurality of write requests corresponding to each storage unit in the first subset are generated for transmission via a network, where each of the first plurality of write requests includes one of a plurality of encoded slices of a data object.

Figure 11:
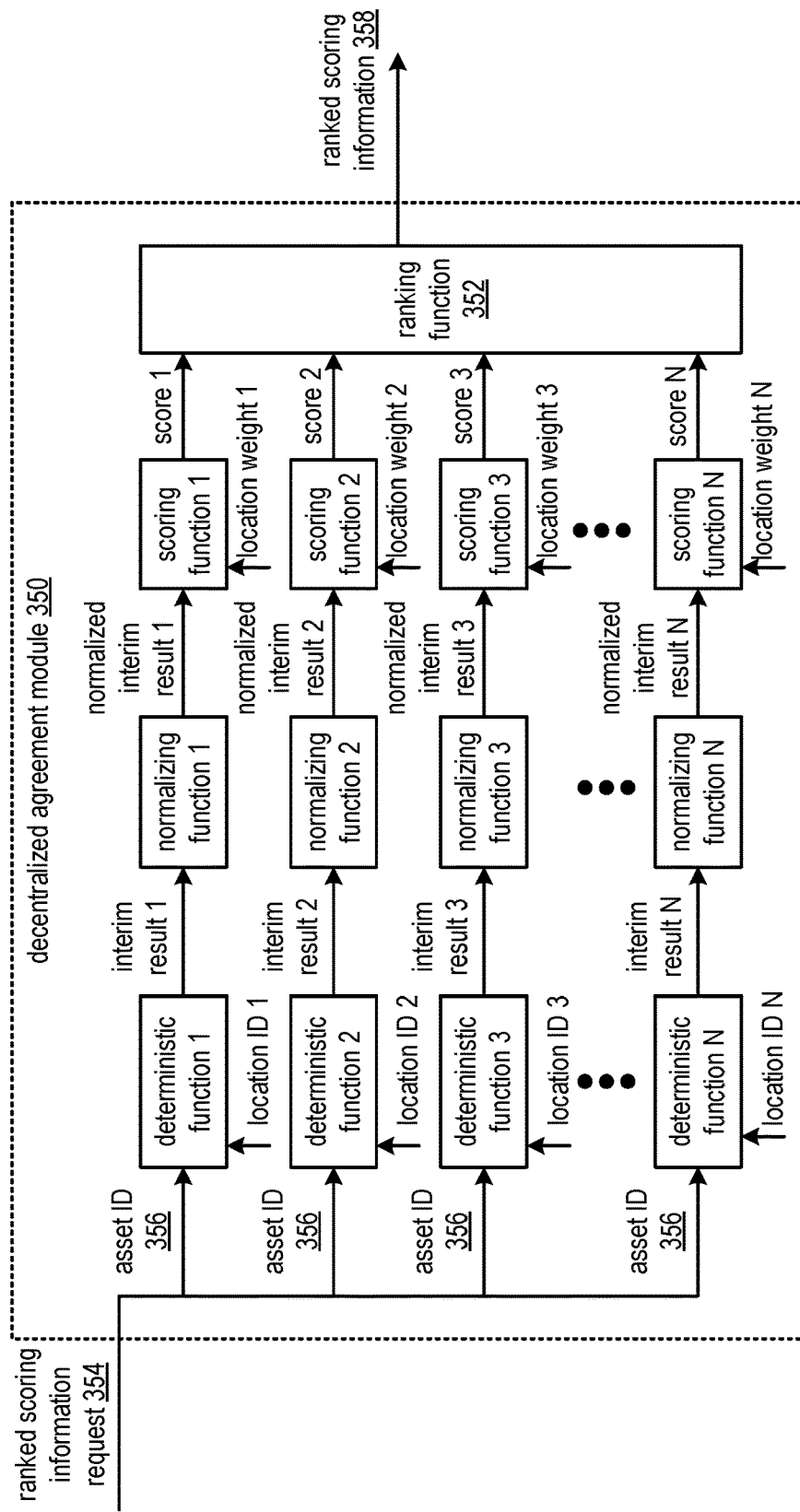
FIG. 11 is a schematic block diagram of an embodiment of a decentralized agreement module in accordance with the present invention.

FIG. 11 is a schematic block diagram of an embodiment of a decentralized agreement module 350 that includes a set of deterministic functions 1-N, a set of normalizing functions 1-N, a set of scoring functions 1-N, and a ranking function 352. Each of the deterministic function, the normalizing function, the scoring function, and the ranking function 352, may be implemented utilizing the computing core 26 of FIG. 2. The decentralized agreement module 350 may be implemented utilizing any module and/or unit of a dispersed storage network (DSN). For example, the decentralized agreement module is implemented utilizing the distributed storage and task (DST) client module 34 of FIG. 1. In various embodiments, storage units will be selected according to the hierarchical structure described previously by utilizing the decentralized agreement module.

The decentralized agreement module 350 functions to receive a ranked scoring information request 354 and to generate ranked scoring information 358 based on the ranked scoring information request 354 and other information. The ranked scoring information request 354 includes one or more of an asset identifier (ID) 356 of an asset associated with the request, an asset type indicator, one or more location identifiers of locations associated with the DSN, one or more corresponding location weights, and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID 356 of the asset includes one or more of a data name, a data record identifier, a source name, a slice name, and a plurality of sets of slice names.

Each location of the DSN includes an aspect of a DSN resource. Examples of locations includes one or more of a storage unit, a memory device of the storage unit, a site, a storage pool of storage units, a pillar index associated with each encoded data slice of a set of encoded data slices generated by an information dispersal algorithm (IDA), a DS client module 34 of FIG. 1, a computing device 12-16 of FIG. 1, an integrity unit 20 of FIG. 1, and a managing unit 18 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others. The other information may include a set of location identifiers and a set of location weights associated with the set of location identifiers. For example, the other information includes location identifiers and location weights associated with a set of memory devices of a storage unit when the requesting entity utilizes the decentralized agreement module 350 to produce ranked scoring information 358 with regards to selection of a memory device of the set of memory devices for accessing a particular encoded data slice (e.g., where the asset ID includes a slice name of the particular encoded data slice).

The decentralized agreement module 350 outputs substantially identical ranked scoring information for each ranked scoring information request that includes substantially identical content of the ranked scoring information request. For example, a first requesting entity issues a first ranked scoring information request to the decentralized agreement module 350 and receives first ranked scoring information. A second requesting entity issues a second ranked scoring information request to the decentralized agreement module and receives second ranked scoring information. The second ranked scoring information is substantially the same as the first ranked scoring information when the second ranked scoring information request is substantially the same as the first ranked scoring information request.

As such, two or more requesting entities may utilize the decentralized agreement module 350 to determine substantially identical ranked scoring information. As a specific example, the first requesting entity selects a first storage pool of a plurality of storage pools for storing a set of encoded data slices utilizing the decentralized agreement module 350 and the second requesting entity identifies the first storage pool of the plurality of storage pools for retrieving the set of encoded data slices utilizing the decentralized agreement module 350.

In an example of operation, the decentralized agreement module 350 receives the ranked scoring information request 354. Each deterministic function performs a deterministic function on a combination and/or concatenation (e.g., add, append, interleave) of the asset ID 356 of the ranked scoring information request 354 and an associated location ID of the set of location IDs to produce an interim result. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 2 appends a location ID 2 of a storage pool 2 to a source name as the asset ID to produce a combined value and performs the mask generating function on the combined value to produce interim result 2.

With a set of interim results 1-N, each normalizing function performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 2 performs the normalizing function on the interim result 2 to produce a normalized interim result 2.

With a set of normalized interim results 1-N, each scoring function performs a scoring function on a corresponding normalized interim result to produce a corresponding score. The performing of the scoring function includes dividing an associated location weight by a negative log of the normalized interim result. For example, scoring function 2 divides location weight 2 of the storage pool 2 (e.g., associated with location ID 2) by a negative log of the normalized interim result 2 to produce a score 2.

With a set of scores 1-N, the ranking function 352 performs a ranking function on the set of scores 1-N to generate the ranked scoring information 358. The ranking function includes rank ordering each score with other scores of the set of scores 1-N, where a highest score is ranked first. As such, a location associated with the highest score may be considered a highest priority location for resource utilization (e.g., accessing, storing, retrieving, etc., the given asset of the request). Having generated the ranked scoring information 358, the decentralized agreement module 350 outputs the ranked scoring information 358 to the requesting entity.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or maybe distributed located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a dispersed storage and task (DST) processing unit of a dispersed storage network (DSN) that includes a plurality of storage units, the method comprises:

selecting a first width number from a first hierarchal storage location level of the DSN;
selecting a second width number from a second hierarchal storage location level of the DSN, wherein the second hierarchal storage level is a sub-division of the first hierarchal storage location level;
selecting a base width number from a base hierarchal storage location level of the DSN, wherein the base hierarchal storage level is a sub-division of the second hierarchal storage location level, and wherein a storage location of the base hierarchal storage location level includes one or more storage units of the plurality of storage units;
selecting an information dispersal algorithm (IDA) value based on a maximum IDA value and a DSN performance value;
identifying a first subset of the plurality of storage units based on the first, second, and base width numbers and the selected IDA value; and
generating a first plurality of write requests for sending to the first subset of the plurality of storage units, wherein each of the first plurality of write requests includes one of a plurality of encoded slices of a data object.

2. The method of claim 1, wherein the selecting one or more of the first, second, and base width numbers is based on a decentralized agreement protocol (DAP).

3. The method of claim 1, wherein the identifying the first subset of the plurality of storage units further comprises:
selecting a number of storage units from each storage location of the base width number of storage locations of the base hierarchal storage location level as the first subset of the plurality of storage units such that the first subset of the plurality of storage units are equally distributed among the base width number of storage locations.

4. The method of claim 3, wherein the selecting the number of storage units from each location of the base width number of storage locations further comprises:
calculating the number of storage units from each location of the base width number of storage locations by dividing the selected IDA value by the base width number.

5. The method of claim 1, wherein the first hierarchal storage location level includes a plurality of geographical regions and the first width number includes a selected number of geographical regions of the plurality of geographical regions, the second hierarchal storage location level includes a plurality of cities selected based on the selected number of geographical regions and the second width number includes a selected number of cities of the plurality of cities, and the base hierarchal storage location level includes a plurality of data centers selected based on the selected cities and the base width number includes a selected number of data centers of the plurality of data centers.

6. The method of claim 1, wherein the identifying the first subset of the plurality of storage units further comprises:
selecting the first subset of the plurality of storage units based on location parameter data.

7. The method of claim 6, wherein the location parameter data includes location weight data indicating at least one location weight corresponding to at least one of: at least one storage location from the first hierarchal storage location level, at least one storage location from the second hierarchal storage location level, or at least one storage location from the base hierarchal storage location level, wherein a distribution of the first subset of the plurality of storage units among the base width number of storage locations from the base hierarchal storage location level is based on the location weight data.

8. The method of claim 1, wherein the identifying the first subset of the plurality of storage units is further based on a decentralized agreement protocol (DAP).

9. The method of claim 1, further comprises:
selecting one or more of the first width number, the second width number, the base width number, and a desired number of storage units per storage location of the base hierarchal storage location level based on width parameter data.

10. The method of claim 1, wherein the selecting the IDA value further comprises:
calculating the product of the first width number, the second width number, the base width number, and a number of storage units available on each storage location of the base hierarchal storage location level to determine the maximum IDA value; and
selecting the selected IDA value to be less than or equal to the maximum IDA value in accordance with the DSN performance level, wherein the DSN performance level indicates one or more of: a status of one or more units of the DSN, loading of the one or more units of the DSN, and wherein the status includes failed, added, upgraded, repaired, expanded, replaced, deleted, activated, and deactivated, and wherein the one or more units of the DSN includes the plurality of storage units.

11. The method of claim 1, further comprising:
generating reassignment data in response to a change in one or more of the first width number, the second width number, the base width number, and the selected IDA value, wherein the reassignment data indicates a mapping of the plurality of encoded slices to a second subset of the plurality of storage units of the DSN based on the change in the one or more of the first width number, the second width number, the base width number and the selected IDA value; and
generating a second plurality of write requests for sending to the second subset, wherein each of the second plurality of write requests includes one of the plurality of encoded slices of a data object based on the reassignment data.

12. A processing system of a dispersed storage and task (DST) processing unit of a dispersed storage network (DSN) that includes a plurality of storage units comprises:
at least one processor;
a memory that stores operational instructions, that when executed by the at least one processor cause the processing system to:
select a first width number from a first hierarchal storage location level of the DSN;
select a second width number from a second hierarchal storage location level of the DSN, wherein the second hierarchal storage level is a sub-division of the first hierarchal storage location level;
select a base width number from a base hierarchal storage location level of the DSN, wherein the base hierarchal storage level is a sub-division of the second hierarchal storage location level, and wherein a storage location of the base hierarchal storage location level includes one or more storage units of the plurality of storage units;
select an information dispersal algorithm (IDA) value based on a maximum IDA value and a DSN performance value;

identify a first subset of the plurality of storage units based on the first, second, and base width numbers and the selected IDA value; and
generate a first plurality of write requests for sending to the first subset of the plurality of storage units, wherein each of the first plurality of write requests includes one of a plurality of encoded slices of a data object.

13. The processing system of claim 12, wherein the operational instructions, when executed by the at least one processor, further cause the processing system to select one or more of the first, second, and base width numbers based on a decentralized agreement protocol (DAP).

14. The processing system of claim 12, wherein the identifying the first subset of the plurality of storage units further comprises:
selecting a number of storage units from each storage location of the base width number of storage locations of the base hierarchal storage location level as the first subset of the plurality of storage units such that the first subset of the plurality of storage units are equally distributed among the base width number of storage locations.

15. The processing system of claim 14, wherein the operational instructions, when executed by the at least one processor, further cause the processing system to select the number storage units from each location of the base width number of storage locations by:
calculating the number of storage units from each location of the base width number of storage locations by dividing the selected IDA value by the base width number.

16. The processing system of claim 12, wherein the first hierarchal storage location level includes a plurality of geographical regions and the first width number includes a selected number of geographical regions of the plurality of geographical regions, the second hierarchal storage location level includes a plurality of cities selected based on the selected number of geographical regions and the second width number includes a selected number of cities of the plurality of cities, and the base hierarchal storage location level includes a plurality of data centers selected based on the selected cities and the base width number includes a selected number of data centers of the plurality of data centers.

17. A non-transitory computer readable storage device comprises:
at least one memory section that stores operational instructions that, when executed by a processing system of a dispersed storage network (DSN) that includes a processor and a memory, causes the processing system to:
select a first width number from a first hierarchal storage location level of the DSN;
select a second width number from a second hierarchal storage location level of the DSN, wherein the second hierarchal storage level is a sub-division of the first hierarchal storage location level;
select a base width number from a base hierarchal storage location level of the DSN, wherein the base hierarchal storage level is a sub-division of the second hierarchal storage location level, and wherein a storage location of the base hierarchal storage location level includes one or more storage units of the plurality of storage units;
select an information dispersal algorithm (IDA) value based on a maximum IDA value and a DSN performance value;

identify a first subset of the plurality of storage units based on the first, second, and base width numbers and the selected IDA value; and generate a first plurality of write requests for sending to the first subset of the plurality of storage units, wherein each of the first plurality of write requests includes one of a plurality of encoded slices of a data object.

18. The method of claim 1 further comprises:

selecting a third width number from a third hierarchal storage location level of the DSN, wherein the third hierarchal storage level is a sub-division of the second hierarchal storage location level;

selecting the base width number from the base hierarchal storage location level of the DSN, wherein the base hierarchal storage level is a sub-division of the third hierarchal storage location level; and identifying the first subset of the plurality of storage units based on the first, second, third, and base width numbers and the selected IDA value.

* * * * *